United States Patent [19]

Machida et al.

[11] Patent Number: 4,732,761
[45] Date of Patent: Mar. 22, 1988

[54] THIN FILM FORMING APPARATUS AND METHOD

[75] Inventors: Katsuyuki Machida, Isehara; Hideo Oikawa, Koganei, both of Japan

[73] Assignee: Nippon Telegraph and Telephone Corporation, Tokyo, Japan

[21] Appl. No.: 842,244

[22] Filed: Mar. 21, 1986

[30] Foreign Application Priority Data

Mar. 23, 1985 [JP] Japan .................. 60-57569

[51] Int. Cl.⁴ .............................. B05D 5/12
[52] U.S. Cl. .................. 437/228; 156/646;
204/192.23; 204/192.32; 427/38; 427/45.1;
427/47; 427/294; 427/350; 437/238; 437/245
[58] Field of Search ............ 427/38, 45.1, 47, 294,
427/350; 424/228, 238, 245; 204/192.23,
192.32; 156/646

[56] References Cited

U.S. PATENT DOCUMENTS

| 4,298,419 | 1/1981 | Suzuki et al. | 156/345 |
| 4,401,054 | 8/1983 | Matsuo et al. | 118/723 |
| 4,438,368 | 4/1984 | Abe et al. | 315/39 |

FOREIGN PATENT DOCUMENTS

| 1361214 | 7/1974 | United Kingdom . |
| 1418278 | 12/1975 | United Kingdom . |
| 1553181 | 9/1979 | United Kingdom . |

OTHER PUBLICATIONS

J. Vac. Sci. Technol., 15(3), May/Jun. 1978; 1978 American Vaccum Society, pp. 1105–1112, Ting et al. Electron Cyclotron Resonance Plasma Deposition Technique Using Raw Material Supply by Sputtering, Japan Journal of Applied Physics, vol. 23, No. 8, 8–84, pp. 1534 to 1536, Ono et al.

Primary Examiner—Bernard D. Pianalto
Attorney, Agent, or Firm—Cushman, Darby & Cushman

[57] ABSTRACT

An apparatus for forming a thin film to planarize a surface of a semiconductor device having convex and concave regions, comprising a plasma generating chamber into which are an Ar gas and an $O_2$ gas are supplied so that a plasma is produced; a specimen chamber in which a substrate electrode upon which a specimen substrate is placed and which is in partial communication with the plasma generating chamber and into which an $SiH_4$ gas as a film material is introduced; and a bias power source for applying a bias voltage to the substrate electrode so that ions sufficiently impinge substantially vertically upon the electrode to perform ion etching. First, an $SiO_2$ film is deposited on the specimen substrate by using the $O_2$ and $SiH_4$ gases. In the next step, Ar plasma and $O_2$ plasma are produced in the plasma generating chamber and a bias voltage is applied to the substrate electrode. As a result, deposition and etching occur simultaneously, whereby the surface of the device having convex and concave regions is planarized with an $SiO_2$ film. Submicron interconnections can be planarized with easily setting planarization conditions at a low rf power. The planarization time can be shortened.

14 Claims, 19 Drawing Figures

THIN FILM FORMING APPARATUS AND METHOD

BACKGROUND OF THE INVENTION

1. Field of the Invention

The present invention relates to an apparatus and a method for forming a thin film such as an insulator film to planarize a surface of a semiconductor device having convex and concave regions.

2. Description of the Prior Art

In order to obtain an LSI with a high degree of packaging density and a high degree of reliability in operation, the planarization technique for planarizing elements and interconnection is essential. There have been proposed and demonstrated various planarization techniques such as a lift-off method, an etch-back method, a spin-on method, a bias sputtering method and so on. The lift-off method has a problem that its process is complicated and a problem that the resist used in this process is not fully removed. The etch-back method has problems such as the difficulty of uniformly applying a resin and uniformly controlling a thickness of a wafer being etched. According to the spin-on method, the thickness of a film must be sufficiently increased in order to prevent pinholes, so that there arise the problems that it is difficult to form a extremely fine through-hole because an aspect ratio of the through-hole becomes higher. In addition, there are the problems of a high dielectric constant and of contamination.

The bias sputtering method (see, for example, C. Y. Ting, "Study of planarized sputter-deposited $SiO_2$", J.Vc.Sic. Technol., 15(3), May/June 1978, pp. 1105–1112) has considerable attention recently because only one apparatus is needed to planarize a surface having convex and concave regions by thin film.

FIG. 1 shows a construction of one example for carrying out the above-described bias sputtering method. In FIG. 1, reference numeral 1 designates a substrate electrode; 2, a target electrode; 3A and 3B, electrical power sources for radio frequency (rf) bias; 4, a specimen chamber; 5, a gas introduction system; and 6, a specimen substrate.

With this apparatus, the target electrode 2 is sputtered so that the particles of the material sputtered are deposited on the surface of the specimen substrate 6 to form an insulator film. In this case, an rf voltage from the power source 3B is also applied through the electrode 1 to the specimen substrate 6 so that Ar ions are incident to the substrate 6. The planarization of the insulator film can be accomplished by utilizing the fact that the etching rate of the insulator film by Ar ions is faster on an inclined surface portion of the substrate than on a flat surface of the substrate 6 in parallel with the substrate 6.

The bias sputter method can accomplish the planarization of a thin film, but it has the following defects:

(1) Since the film-forming particles arrive at the surface of a specimen at an inclined incidence angle, it is not possible to deposit a flat insulator film over a concave region of submicron interconnection whose aspect ratio (height/space of interconnection) is substantially equal to 1.0 or higher than 1.0.

(2) Since the specimen substrate 6 is located in a portion where plasma is produced, its temperature rises high so that a thin film cannot be deposited over a resist layer on the substrate.

(3) In order to increase a film deposition rate and an etching rate, the rf powers of the power sources 3A and 3B must be increased. In this case, however, there is the possibility that the substrate 6 is damaged. Accordingly, the increase in the rf power source is limited.

(4) Since the rf power cannot be increased and the deposition rate is relatively decreased due to the etching effect caused by the application of a bias voltage to the substrate, a throughput is low.

(5) If the purity of the target used is low, it frequently occurs that impurities are mixed with a film being deposited.

SUMMARY OF THE INVENTION

In view of the above, one of the objects of the present invention is to provide a method and an apparatus for forming a film over a surface of a semiconductor device having submicron-order convex and concave with an aspect ratio near to 1.0 or higher than 1.0.

Another object of the present invention is to provide a method of planarization which can be carried out in a simple manner, ensuring a low damage to a substrate and a high throughput.

A yet another object of the present invention is to provide an apparatus for planarization for submicron LSI interconnection surface and in which planarization conditions can be determined in a simple manner.

The present invention was made based on the recognition that when an ECR film deposition method (as disclosed in U.S. Pat. No. 4,401,054) which is a film formation method having no object of planarization for interconnect surface is suitably combined with sputtering method, a rough surface having convex and concave with a high aspect ratio in LSI can be planarized perfectly.

In the first aspect of the present invention, an apparatus for forming a thin film to planarize a surface of a semiconductor device having convex and concave regions comprises:

a plasma generating chamber into which a gas is introduced to produce plasma;

a specimen chamber having a substrate electrode, which is disposed in the specimen chamber and upon which a specimen substrate is to be placed, and a window which is disposed above the substrate electrode;

a first gas introduction system which can selectively introduce a first material gas of a thin film to be deposited on the specimen substrate and an inert gas into the plasma generating chamber;

a second gas introduction system which introduces a second material gas of a thin film to be deposited on the specimen substrate into the specimen chamber;

means for introducing the plasma from the plasma generating chamber into the specimen chamber via the window and for impinging the introduced plasma substantially vertically upon the specimen substrate; and a bias electrical power source for applying a high frequency bias voltage to the substrate electrode in such a manner that the ions of the inert gas, which impinge substantially vertically upon the specimen substrate, have sufficient energy for etching the film depostied on the specimen substrate.

Here, the plasma generating chamber may comprise window for introducing microwave thereinto and microwave introducing means having a magnetic circuit arranged around the plasma generating chamber in such a way that a magnetic flux density required to cause electron cyclotron resonance in the plasma generating chamber is generated and that there is formed a diverging magnetic field in which a magnetic flux denstiy is decreased toward the specimen substrate from the window.

The power of the bias electrical power source may be determined to satisfy:

(the power)/(the area of the substrate electrode)
$\geq 0.88$ [W/cm$^2$].

The flow rates of the gases introduced from the first and second gas introduction means may be variable and the bias voltage derived from the bias electrical power source may be variable.

A target made of a material to be sputtered may be disposed around the window and extended toward the specimen chamber; a DC or rf voltage may be applied to the target; and a power source may be provided to sputter the target by plasma of the inert gas generated in the plasma generating chamber.

The means for introduction plasma from the plasma generating chamber into the specimen chamber may comprise means for applying an electric field to the plasma.

In the second aspect of the present invention, a method for forming a thin film to planarize a surface of a semiconductor device having convex and concave regions by an apparatus having a plasma generating chamber into which a gas is introduced to produce plasma; a specimen chamber having a substrate electrode, which is disposed in the specimen chamber and upon which a specimen substrate is to be placed, and a window which is disposed above the substrate electrode; a first gas introduction system which can selectively introduce a first material gas of a thin film to be deposited on the specimen substrate and an inert gas into the plasma generating chamber; a second gas introduction system which introduces a second material gas of a thin film to be deposited on the specimen substrate into the specimen chamber; means for introducing the plasma from the plasma generating chamber into the specimen chamber via the window and for impinging the introduced plasma substantially vertically upon the specimen substrate; and a bias electrical power source for applying a high frequency bias voltage to the substrate electrode in such a manner that the ions of the inert gas, which impinge substantially vertically upon the specimen substrate have sufficient energy for etching the film depostied on the specimen substrate, the method comprises the steps of:

placing the specimen substrate on the substrate electrode;

maintaining both the plasma generating chamber and the specimen chamber in a vacuum condition;

introducing the first material gas and the second material gas from the first and second gas introduction systems, respectively;

applying a bias voltage derived from the bias electrical power source to the substrate electrode;

depositing a thin film consisting of particles resulting from the reaction between the first and second material gases upon the specimen substrate; and introducing further the inert gas from the first gas introduction system into the plasma generating chamber while the bias voltage is being applied to the substrate electrode, so that the ions of the inert gas impinge substantially vertically upon the specimen substrate, while making the film deposition rate substantially equal to the etching rate, thereby forming a thin film having a planar surface by the raw materials on the specimen substrate.

In the third aspect of the present invention, a method for forming a planar film to planarize a surface of a semiconductor device having convex and concave regions by an apparatus having a plasma generating chamber into which a gas is introduced to produce plasma; a specimen chamber having a substrate electrode, which is disposed in the specimen chamber and upon which a specimen substrate is to be placed, and a window which is disposed above the substrate electrode; a first gas introduction system which can selectively introduce a first material gas of a thin film to be deposited on the specimen substrate and an inert gas into the plasma generating chamber; a second gas introduction system which introduces a second material gas of a thin film to be deposited on the specimen substrate into the specimen chamber; means for introducing the plasma from the plasma generating chamber into the specimen chamber via the window and for impinging the introduced plasma substantially vertically upon the specimen substrate; and a bias electrical power source for applying a high frequency bias voltage to the substrate electrode in such a manner that the ions of the inert gas, which impinge substantially vertically upon the specimen substrate have sufficient energy for etching the film depostied on the specimen substrate, the method comprises the steps of:

placing, as the specimen substrate, a specimen having a convex pattern on its surface and a resist pattern formed on the convex pattern on the substrate electrode;

maintaining both the plasma generating chamber and the specimen chamber in a vacuum condition;

introducing a first material gas and a second material gas from the first and second gas introduction systems, respectively;

depositing a thin film consisting of particles resulting from the reaction between the first and second material gases upon the specimen substrate without applying no bias voltage from the bias electrical power source to the substrate electrode;

introducing further the inert gas from the first gas introduction system into the plasma generating chamber while the bias voltage is being applied to the substrate electrode;

effecting the deposition of the particles upon the specimen substrate and the etching of the deposited film simultaneously, so that the recess between the convex patterns is filled with the deposited films of the particles to a depth substantially equal to the thickness of the convex pattern; and introducing only the first material gas from the first gas introduction system into the plasma generating chamber while the introduction of the second material gas from the second gas introduction system into the specimen chamber is interrupted, thereby removing the resist pattern so that the convex pattern is substantially coplanar with the deposited film of the particles.

Here, a microwave power and a magnetic field may be supplied to the plasma generating chamber so as to generate plasma of the first materaial gas under a condition of electron cyclotron resonance and the generating plasma may be introduced into the specimen chamber under the interaction with the magnetic field so that the plasma reacts with the second material gas to direct the particles to impinge substantially vertically upon the specimen substrate.

The microwave power, the bias voltage, the flow rates of the first and second material gases and the flow rate of the inert gas may be varied so that the relative relationship between the film deposition rate and the etching rate may be controlled to a desired relationship.

In the fourth aspect of the present invention, a method for forming a thin film to planarize a surface of a semiconductor device having convex and concave regions by an apparatus having a plasma generating chamber into which a gas introduced to produce plasma; a specimen chamber having a substrate electrode which is disposed in the speciment chamber and upon which a speciment substrate is to be placed, and a window which is disposed above the substrate electrode; a first gas introduction system which can selectively introduce a first material gas of a thin film to be deposited on the specimen substrate and an inert gas into the plasma generating chamber; a second gas introduction system which introduces a second material gas of a thin film to be deposited on the specimen substrate into the speciment chamber; means for introducing the plasma from the plasma generating chamber into the specimen chamber via the window and for impinging the introduced plasma substantially vertically upon the specimen substrate; and a bias electrical power source for applying a high frequency bias voltage to the substrate electrode in such a manner that the ions of the inert gas, which impinge substantially vertically upon the specimen substrate have sufficient energy for etching the film depostied on the specimen substrate, the method comprises the steps of:

placing the specimen substrate on the substrate electrode;

maintaining both the plasma generating chamber and the specimen chamber in a vacuum condition;

introducing the first material gas and the inert gas from the first gas introduction system and the second material gas from the second gas introduction system, respectively;

applying a bias voltage derived from the bias electrical power source to the substrate electrode;

depositing a thin film consisting of particles resulting from the reaction between the first and second material gases upon the specimen substrate; and increasing an amount of the inert gas from the first gas introduction system into the plasma generating chamber while the bias voltage is being applied to the substrate electrode, so that the ions of the inert gas impinge substantially vertically upon the specimen substrate, while making the film deposition rate substantially equal to the etching rate, thereby forming a thin film having a planar surface by the raw materials on the specimen substrate.

In the fifth aspect of the present invention, a method for forming a thin film to planarize a surface of a semiconductor device having convex and concave regions by an apparatus having a plasma generating chamber into which a gas is introduced to produce plasma; a specimen chamber having a substrate electrode, which is disposed in the specimen chamber and upon which a specimen substrate is to be placed, and a window which is disposed above the substrate electrode; a first gas introduction system which can selectively introduce a first material gas of a thin film to be deposited on the specimen substrate and an inert gas into the plasma generating chamber; a second gas introduction system which introduces a second material gas of a thin film to be deposited on the specimen substrate into the specimen chamber; means for introducing the plasma from the plasma generating chamber into the specimen chamber via the window and for impinging the introduced plasma substantially vertically upon the specimen substrate; and a bias electrical power source for applying a high frequency bias voltage to the substrate electrode in such a manner that the ions of the inert gas, which impinge substantially vertically upon the specimen substrate have sufficient energy for etching the film depostied on the specimen substrate, the method comprises the steps of:

placing the specimen substrate on the substrate electrode;

maintaining both the plasma generating chamber and the specimen chamber in a vacuum condition;

introducing the first material gas and the second material gas from the first and second gas introduction systems, respectively;

applying a bias voltage derived from the bias electrical power source to the substrate electrode;

depositing a thin film consisting of particles resulting from the reaction between the first and second material gases upon the specimen substrate; and increasing the bias voltage while the bias voltage is being applied to the substrate electrode, to make the film deposition rate substantially equal to the etching rate, thereby forming a thin film having a planar surface by the raw materials on the specimen substrate.

The microwave power, the bias voltage, the flow rates of the first and second material gases may be varied so that the relative relationship between the film deposition rate and the etching rate may be controlled to a desired relationship.

The above and other objects, effects, features and advantages of the present invention will become more apparent from the following description of preferred embodiments thereof taken in conjunction with the accompanying drawings.

DETAILED DESCRIPTION OF PREFERRED EMBODIMENTS

Figure 1:
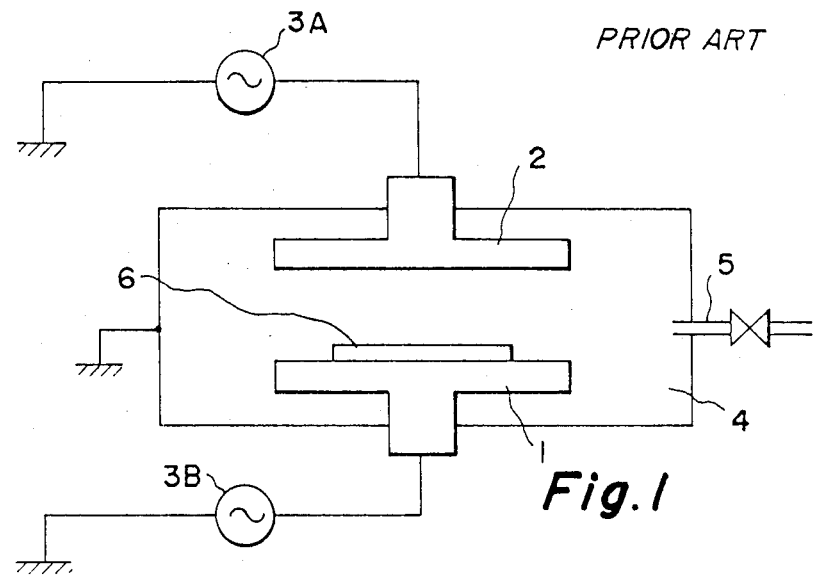
FIG. 1 is a schematic view showing an example of a prior art bias sputtering apparatus.
Figure 2:
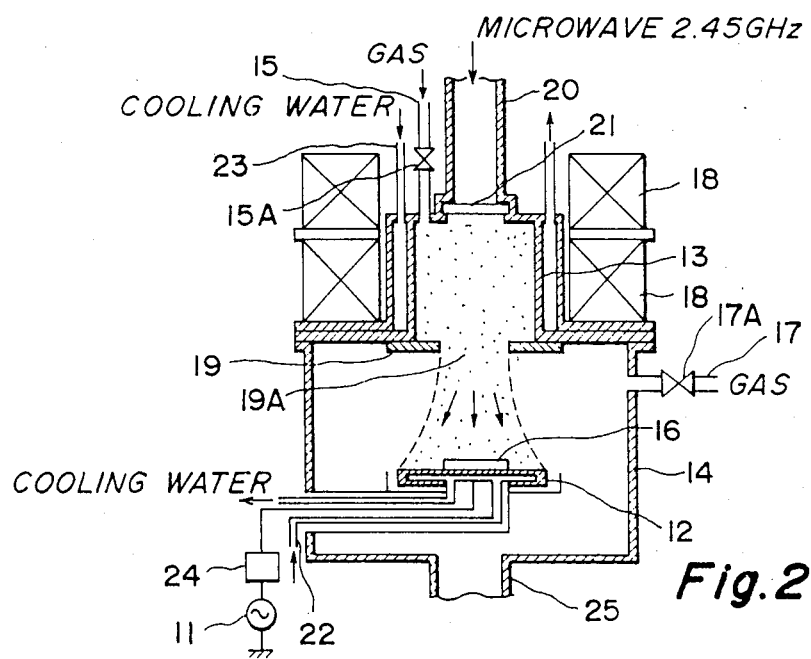
FIG. 2 is a sectional view showing a first embodiment of a film forming apparatus according to the present invention.

FIG. 2 shows a first embodiment of a bias-ECR plasma deposition apparatus in accordance with the present invention. In FIG. 1, reference numeral 11 designates an rf bias source for supplying an rf bias power at, for instance, 13.56 MHz; 12, a substrate electrode; 13, a plasma generating chamber; 14, a specimen chamber; 15, a gas introduction system with a control valve 15A; 16, a specimen substrate; 17, another gas introduction system with a control valve 17A; 18, a magnet coil; 19, a window member with a window 19A; 20, a waveguided tube for introducing a microwave having a frequency of, for instance, 2.54 GHz into the plasma generating chamber 13; 21, a microwave guiding window; 22, a cooling system for feeding a cooling water to the substrate electrode 12; 24, a matching box for feeding the rf power to the substrate electrode 12; and 25, a vacuum system for maintaining both the chambers 13 and 14 in a desired vacuum condition.

The substrate electrode 12 which is connected to the rf bias power source 11 is disposed in the center lower portion of the specimen chamber 14 and the specimen substrate 16 upon which a thin film is to be formed is placed on the substrate electrode 12. The gas introduction system 17 is connected to the side wall of the specimen chamber 14 and is adapted to feed silane gas (SiH$_4$) which is the material of a thin film to be deposited on the substrate 16. The plasma generating chamber 13 is disposed above the specimen chamber 14 and the window 19A is interposed between the plasma generating chamber 13 and the specimen chamber 14 in opposed relationship with the specimen substrate 16. The gas introduction system 15 is connected to the upper portion of the plasma generating chamber 13 and is adapted to feed Ar and O$_2$ gases or the like.

The magnet coil 18 is fitted around the plasma generating chamber 13 so that the ions generated in the plasma generating chamber 13 can be efficiently fed into the specimen chamber 14 by the magnetic field produced by the magnet coil 18. Of various methods for generating ions in the plasma generating chamber 13 such as a parallel flat plate type, a barrel type, an ion beam type and so on, the present invention employs a microwave electron cyclotron resonance type. It should be noted that in order to introduce the ions generated in the plasma generating chamber 13 into the specimen chamber 14, an electric field can be used.

The oxygen ions thus introduced into the specimen chamber 14 act co-operatively with silane gas introduced through the gas introduction system 15 to form a film on the specimen substrate 16.

Meanwhile, when an rf voltage is applied from the bias source 11 to the substrate electrode 12, the substrate 16 is etched by the ions in the specimen chamber 14. By suitably controlling the microwave power, the rf power or the composition of the gases introduced into the specimen chamber 14, the deposition and etching can be carried out simultaneously. Thus, with the apparatus in accordance with the present invention, the deposition particles from an ion source and the ions incident to the substrate can be controlled independently of each other.

Here, the rf power source 11 has a capacity of supplying a sufficient energy to the ions so that a deposited film on the substrate is etched by the ions. The minimum power density (rf power/area of substrate electrode) is preferably 0.88 or more.

According to the present invention, the plasma generating chamber 13 is disposed just above the substrate electrode 12 and the formation of a film is carried out at a vacuum of $10^{-4}$–$10^{-5}$ Torr. Therefore, the deposition particles arrive at the substrate 16 substantially perpendicularly. As a result, the present invention can exhibit excellent characteristics for filling a space of the order of submicron. In addition, ions are also incident substantially vertically to the substrate 16.

Figure 4A:
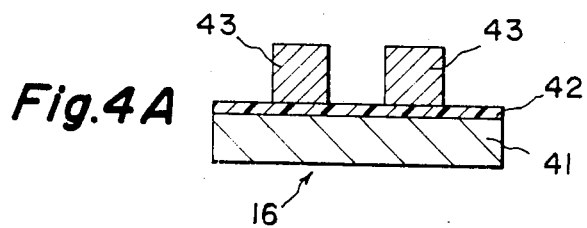
FIGS. 4A–4C are cross sectional views used to explain an embodiment of sequential steps for planarizing a LSI interconnection surface in accordance with the present invention.

The planarization by impinging the deposition particles and the etching ions substantially vertically upon the substrate will be explained later with reference to FIGS. 4A-4C.

With this apparatus, the temperature of the substrate is maintained at a temperature lower than 100° C. with high vacuum of the order of as high as $10^{-4}$–$10^{-5}$ Torr and SiO$_2$, SiN, polycrystalline silicone or the like, which have a high degree of uniformity of a film deposited and a high quality, can be deposited on the substrate 16. In addition, the plasma generating chamber 13 and the specimen chamber 14 are separated from each other, so that the electric field applied to the substrate electrode 12 is used only for determining the energy of ions on the specimen substrate 16. As a consequence, unlike the prior art bias sputtering method, the frequency is not limited to a frequency at which plasma discharge is produced.

Figure 3:
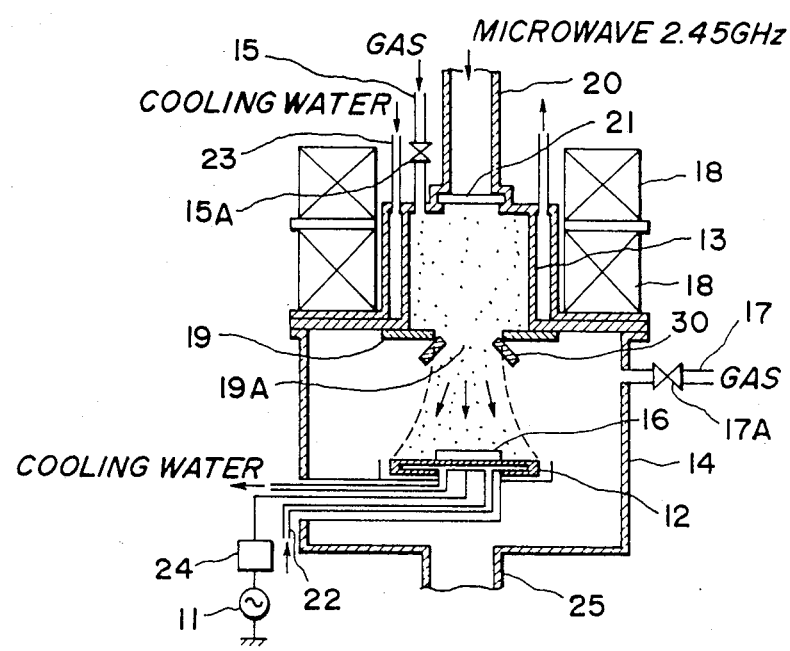
FIG. 3 is a cross sectional view showing another embodiment of a film forming apparatus according to the present invention.

FIG. 3 shows a second embodiment of a film depositing apparatus according to the present invention which is substantially similar in construction to the first embodiment described above with reference to FIG. 2 except that a target 30 made of a material to be sputtered is disposed around the window 19A defined between the plasma generating chamber 13 and the specimen chamber 14 and is extended inwardly into the specimen chamber 14. Here, an electrical power source for supplying an electrical power to the target 30 is not shown. From the power source, a DC or rf voltage is applied to the target 30 depending on its material.

With this apparatus, Ar ions produced in the plasma generating chamber 13 sputter the target 30 to deposit a thin film on the specimen substrate 16 while the etching process is simultaneously carried out by applying an rf bias to the substrate electrode 12. The second embodiment is especially advantageous when a film is formed from materials not obtained as gaseous condition.

Next, an embodiment of a method for forming a planarized LSI interconnection surface according to the present invention in whcih the apparatus of the type described above is used will be explained with reference to FIGS. 4A-4C. A specimen substrate 16 as shown in FIG. 4A is obtained by depositing an insulator film 42 on a semiconductor substrate 41 with active devices formed thereon, forming an Al film of 5000 Å in thickness over the insulator film 42 by the sputtering method, and thereafter patterning the Al film by the photolithography process and etching the Al film with CCl$_4$ to form Al interconnections 43.

The specimen substrate 16 thus prepared is placed on the substrate electrode 12 in the apparatus as shown in FIG. 2 and SiH$_4$ gas is introduced from the gas introduction system 17 while O$_2$ gas is introduced from the gas introduction system 15 without introducing Ar gas from the gas introducing system 15. Thereafter, plasma is generated so that an SiO$_2$ film 44 of 5000 Å in thickness is deposited upon the specimen substrate 16. Since an rf bias is applied simultaneously to the substrate electrode 12 and ions impinge upon the substrate 16 substantially vertically, O$_2$ ions sputter the specimen substrate 16. As a result, as best shown in FIG. 4B, an amount of SiO$_2$ deposited on the inclined surfaces is lesser than that deposited on the horizontal surface due to the etching by O$_2$ ions.

When SiO$_2$ is deposited in the manner described above, the fact that the O$_2$ ion sputtering effect can be obtained by applying an rf bias is remarkably different from a bias sputtering method in which etching proceeds only with Ar ions. That is, in the present embodiment, no Ar ions are supplied, and accordingly Si and SiO$_2$ are etched by O$_2$ ions, but metal such as Al is not etched at all. In the initial stage of deposition, it is not requried to introduce Ar, so that it is possible to apply an rf power even from the initial stage of the planarization process. This results in that the planarization time can be shortened.

Figure 5:
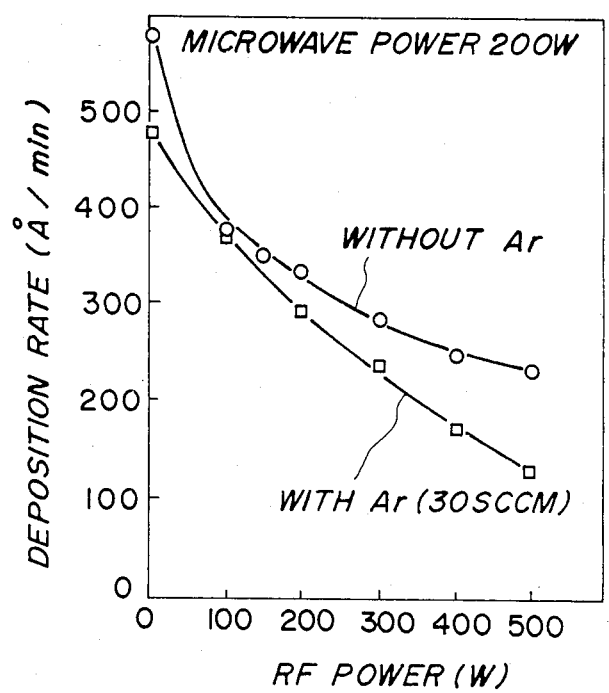
FIG. 5 illustrates rf power dependence of the deposition rate.

FIG. 5 shows various deposition rates (Å/min) when no Ar gas is introduced into the plasma generating chamber 13 and when an Ar gas is introduced thereinto at a rate of 30 SCCM, respectively, under the conditions that the microwave power is maintained at 200 W and both the flow rates of the SiH$_4$ and O$_2$ gases are 20 SCCM.

Referring back to FIG. 4B, the Al interconnections 43 are not etched and the SiO$_2$ film 44 is deposited in the space between the interconnections 43 without overhanging shape. After the deposition, the gas introduction system 15 introduces Ar gas in addition to the O$_2$ gas while the gas introduction system 17 still keeps the introduction of the SiH$_4$ gas. In this manner, in addition to the SiH$_4$ gas and the O$_2$ gas, the Ar gas is also introduced into the plasma generating chamber 13, so that SiO$_2$ is further deposited on the film 44 while an rf bias is applied to the substrate electrode 12. The introduction of the Ar gas enhances the etching rate and the film deposition rate is substantially made equal to the etching rate. Here, both the ions and the particles to be deposited impinge upon the specimen substrate 16 substantially vertically.

Since the deposition particles impinge substantially vertically upon the substrate, the particles are deposited to form a film on a surface of the substrate which is substantially parallel to the main surface of the substrate. Under the condition, the deposition particles are introduced even into slots having a large aspect ratio so that the slots are filled up by the particles. On the other hand, the etching ions also impinge substantially vertically upon the substrate simultaneously with the deposition particles, so that a portion of the deposition particles are removed by the etching ions even though the deposition particles once land on the substrate. Therefore, if the deposition rate is substantially equal to the etching rate (the deposition rate is made slightly lower than the etching rate), the particles are gradually deposited to form a film on a surface of the substrate which is substantially parallel to the main surface of the substrate, even if the surface has a portion with a high aspect ratio. In this case, however, on the surface inclined to the substrate such as the portion 44A as shown in FIG. 4B, the etching ions impinge upon the inclined surface obliquely, so that the etching rate in such an inclined portion becomes higher than the deposition rate. Accordingly, the inclined portion 44A is removed by the etching ions, while the slot portion having a high aspect ratio is filled with the deposition particles.

Figure 4B:
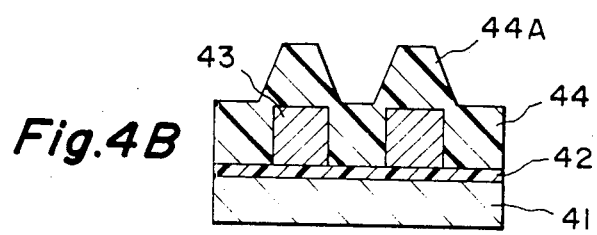

As a result, the convex portion 44A of the SiO$_2$ film 44 shown in FIG. 4B is etched out, so that the thickness of the film becomes uniform on the planer portion. Thus, planarization can be accomplished. FIG. 4C shows the structure with the SiO$_2$ film 44 obtained by the above-described process.

Figure 4C:
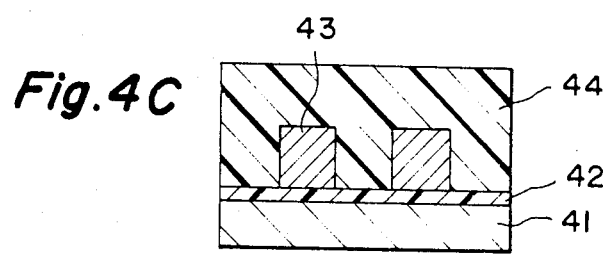

Further, the introduction of the Ar gas and the application of the rf bias can be interrupted after the structure shown in FIG. 4C is obtained. And only the SiH$_4$ and O$_2$ gases can be introduced to further form a thin film of a desired thickness.

In the case of planarization of an Si$_3$N$_4$ film, it suffices that instead of the O$_2$ gas, an N$_2$ gas can be introduced. It is to be understood that the present invention is not limited to the planarization of an insulator film and that it may be equally applied to a planarization for a surface having convex and concave portions.

Figure 6:
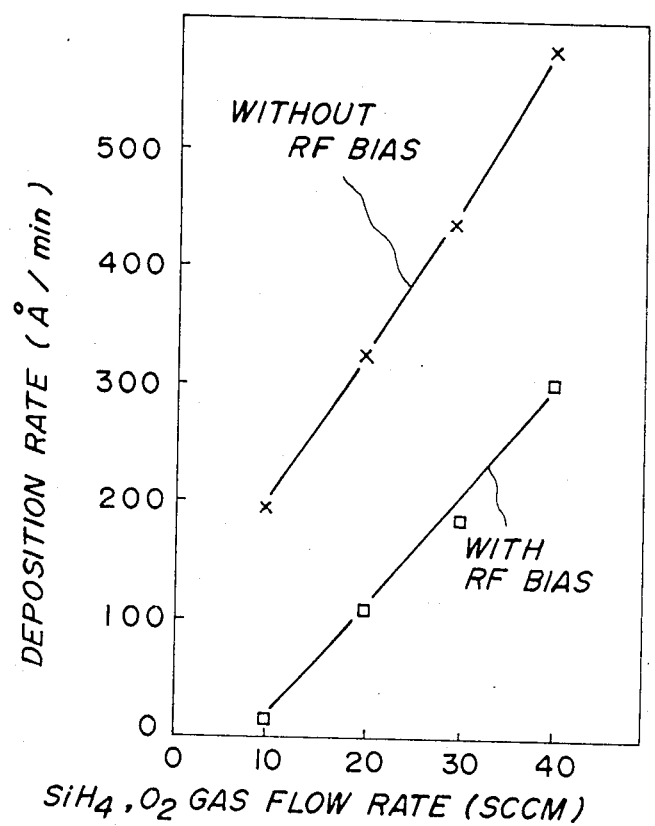
FIG. 6 illustrates gas flow rate dependence of the deposition rate.

FIG. 6 illustrates the deposition rate when the flow rates of the SiH$_4$ and O$_2$ gases are varied. The overall flow rate of the SiH$_4$ and O$_2$ gases is plotted along the abscissa while the deposition rate is plotted along the ordinate. The flow rate of the SiH$_4$ gas was equal to that of the O$_2$ gas and the rf and microwave powers were maintained at 200 W.

A characteristic curve plotted by X marks was obtained when no Ar gas was introduced while no rf power was applied to the substrate electrode 12. A characteristic curve plotted by □ marks was obtained when the Ar gas was introduced at a rate of 30 SCCM while the rf power was applied to the substrate electrode 12. Here, it is suggested that the difference between the two characteristic curves at the same flow rate indicates an Ar etching rate by the rf bias.

It is seen from FIG. 6 that the deposition rate of SiO$_2$ is decreased due to the application of the rf power to the substrate electrode 12 and the introduction of the Ar gas. A possible explanation of this decrease is that this decrease corresponds to the etched amount by Ar etching. It is also seen from the □-plotted characteristic curve that when the applied rf power is maintained at a constant value, the lesser the overall flow rate of the SiH$_4$ and O$_2$ gases, the higher the ratio of the etching rate relative to the deposition rate. In other words, by controlling the flow rates of the SiH$_4$, O$_2$ and Ar gases, respectively, in addition to the variation of the rf power, the ratio between the deposition rate and the etching rate can be varied widely.

Further, the ratio between the deposition rate and the etching rate can be also varied to a desired value by varying the microwave power.

As a result, the conditions for attaining planarization can be easily set in a simple manner and the planarization can be attained with a low rf power, so that damage to a substrate can be minimized.

That is, in a prior art bias sputtering method, the deposition rate and the etching rate are made substantially equal to each other and in order to attain a faster etching rate, the rf power applied to the substrate electrode must be increased so that extensive damage is inflicted on the device. In contrast, the present invention can substantially overcome such problems as described above.

Here, the relationship of the planarization factor with the rf power density will be explained with reference to FIGS. 7A-7C.

Figure 7A:
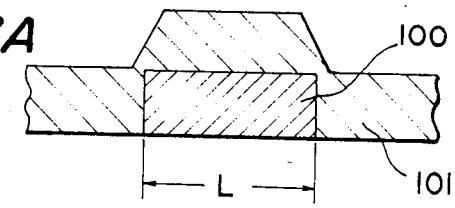
FIG. 7A–7C illustrate a relationship of rf power density with planarization factor.
Figure 7B:
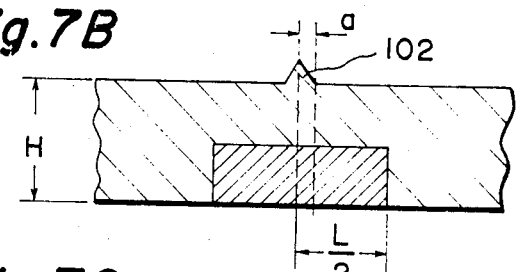

As shown in FIG. 7A, a film 101 is deposited on a specimen substrate having a convex portion 100 having a width L while a bias voltage applied to the substrate. Then, a structure as shown in FIG. 7B is obtained by increasing an etching speed by adding an Ar gas. In this case, a protrusion 102 is formed on the film 101 corresponding to the convex portion 100. Here, it is assumed that a half value of the width of the protrusion 102 is a and thickness of the film 101 is H. A planarization factor is defined as follows:

$$\left(1 - \frac{a}{L/2}\right) \times 100.$$

Figure 7C:
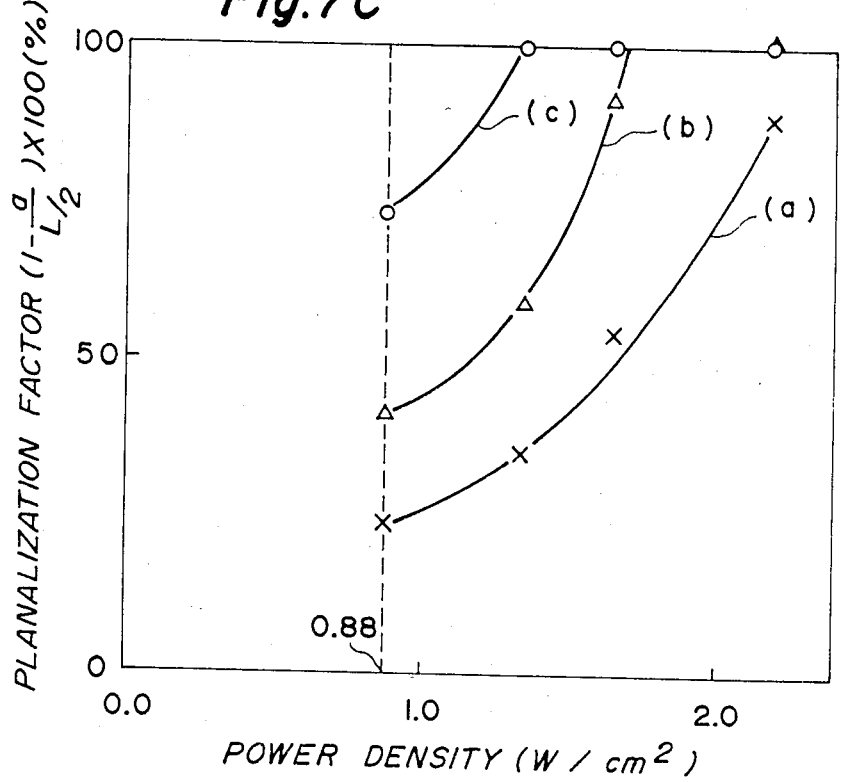

FIG. 7C illustrates the relationship of the thus defined planarization factor with the power density (=rf power/area of the substrate electrode). Here, L=3.0 μm, H=1.0 μm, the microwave power=200 W and a flow rate of the Ar gas=30 SCCM. In FIG. 7C, flow rates of $SiH_4/O_2$ in curves (a), (b) and (c) were 20 SCCM/20 SCCM, 15 SCCM/15 SCCM and 10 SCCM/10 SCCM, respectively.

When the power density is 0.88 (W/cm$^2$) or less, the film first formed on the side wall of the step portion is weak and can be easily etched. Thus, when an etching rate is raised by the addition of Ar or the like, the weak portion is etched, so that the film surface is recessed. Accordingly, a planar surface is not formed. When the power density is equal to or higher than 0.88, the larger the power denstiy, the better the planarization factor is improved when the $SiH_4/O_2$ flow rate ratio is the same. On the other hand, when the power density is the same, the smaller the total flow rate, the better the planarization factor even if the $SiH_4/O_2$ flow rate ratio is the same.

Figure 8:
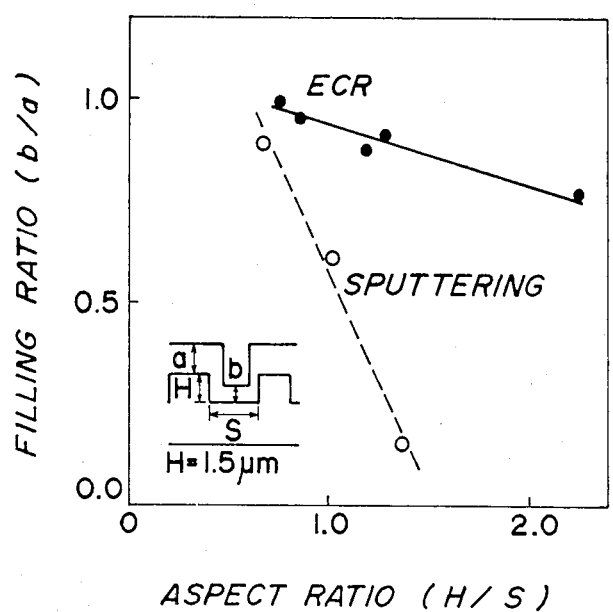
FIG. 8 illustrates aspect ratio dependence of the filling rate.

The relationships between aspect ratio (H/S) and filling ratio (b/a) are shown in FIG. 8 for both the ECR plasma deposition and the conventional sputtering deposition without rf bias. For the ECR plasma deposition, the filling ratio (b/a) becomes larger than 0.9 for the aspect ratio (H/S) of 1.0 and, furthermore, 0.8 even for the aspect ratio of 2.0, since the deposition particles have a substantially vertical incident angle to the substrate. On the other hand, for conventional sputtering deposition, the filling ratio is small, 0.6 for the aspect ratio of 1.0.

As a result, ECR plasma deposition with high directionality can planarize submicron interconnections with a high aspect ratio higher than 1.0. Therefore, ECR plasma deposition is superior to the conventional sputtering deposition for the submicron interconnection.

In the above examples, the $O_2$ and $SiH_4$ gases are first used to form a film having a desired thickness on the substrate having convex and concave by applying a predetermined bias voltage. Then, while the bias voltage is being applied, the Ar gas is additionally applied to control in such a way that the deposition rate is substantially the same as the etching rate to form a thin film. In addition to such a process, the following two embodiments of the method according to the present invention can be used as modification of the above embodiment.

In one method, while a predetermined bias voltage is applied, the $O_2$ gas, the Ar gas and the $SiH_4$ gas are all introduced from the beginning to the end of the process, and the flow rate of the Ar gas is increased during the film formation step in such a way that the deposition rate is substantially the same as the etching rate in order to form a planarized thin film.

In another method, an Ar gas is not used and only the $O_2$ and $SiH_4$ gases are introduced. During the film formation step, the bias voltag is increase in such a way that the deposition rate is substantially the same as the etching rate in order to form a planarized thin film.

Even in these two methods according to the present invention, it is needless to say that the microwave power, the bias voltage value and the flow rates of the first and the second raw materials may be varied in such a way that the relative relation between the film deposition rate and the etching rate is controlled to a desried condidion.

Next, a method for forming a planarized surface in which an insulator film is filled in the space between interconnections so that the top surfaces of the interconnections are exposed and coplaner with the surface of the insulator film will be described with reference to FIGS. 9A-9E.

Figure 9A:
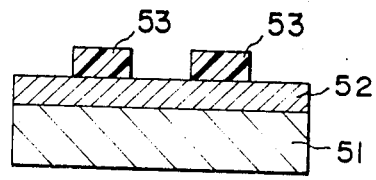
FIGS. 9A–9E are cross sectional views used to explain another embodiment of sequential steps for planarizing LSI interconnection surface in accordance with the present invention.

FIG. 9A shows a structure which is obtained by depositing an Al metal film 52 as a first material having the thickness of 5000 Å on a substrate 51 with active devices formed thereon by a conventional deposition method such as sputtering method, coating a resist film with the thickness of 1.5 μm and patterning by a conventional lithography process to form a resist pattern 53 on the Al film 52.

Figure 9B:
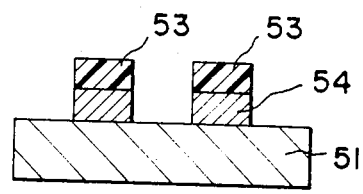

FIG. 9B shows a structure which is obtained by patterning the Al metal film 52 by dry etching process with the resist pattern 53 as a mask in a parallel plate type dry etching apparatus using $CCl_4$, so that interconnections 54 with a desired pattern are obtained.

Figure 9C:
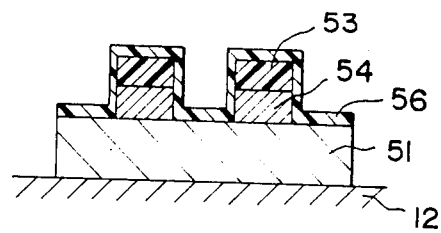

The substrate thus prepared is placed on the substrate electrode 12 of the apparatus as shown in FIG. 2 and the $O_2$ gas is introduced into the plasma generating chamber 13 from the gas introduction system 15 while the $SiH_4$ gas is introduced into the specimen chamber 14 from the gas introduction system 17, so that the plasma is produced to deposit an extremely thin $SiO_2$ film 56 on the specimen substrate with the thickness of 1000 Å as shown in FIG. 9C. In this step, no rf bias power is applied to the substrate electrode 12, so that no etching is processed. FIG. 9C shows the structure after this step.

Figure 9D:
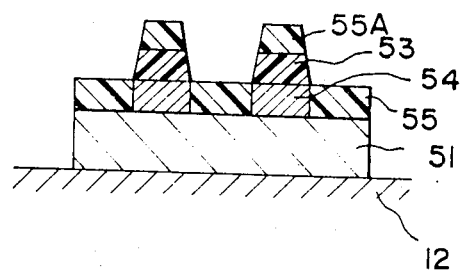

Thereafter, not only the $O_2$ gas but also the Ar gas are introduced into the plasma generating chamber 13 from the gas introduction system 15, while the $SiH_4$ gas is introduced into the specimen chamber 14 from the gas introduction system 17 and the rf bias is applied to the substrate electrode 12, so that $SiO_2$ is deposited to form an $SiO_2$ film 55, while the etching process of the $SiO_2$ film 55 is simultaneously carried out. Thus, the $SiO_2$ film 55 is formed in substantially coplaner relationship with the interconnections 54 as shown in FIG. 9D. In this case, the resist pattern 53 is exposed and its side surfaces are slightly etched out. The $SiO_2$ film 55A is also deposited over the resist pattern 53.

In this step, the resist pattern 53 is not ashered by the $O_2$ plasma, even when the rf bias is applied to the specimen substrate 12 in the atmosphere of $SiH_4$ and $O_2$, because the the extremely thin $SiO_2$ film 56 is previously deposited on the resist pattern 53.

Figure 9E:
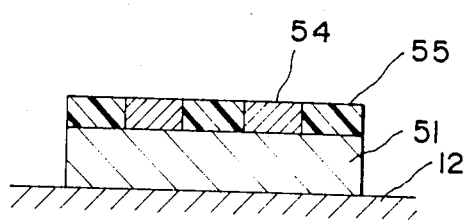

After the structure as shown in FIG. 9D has been obtained, the introduction of the Ar gas from the gas introduction system 15 and the $SiH_4$ gas from the gas introduction system 17 are interrupted and the resist pattern 53 and the insulator film 55 is removed by the $O_2$ plasma, so that a desired structure as shown in FIG. 9E is obtained.

Figure 10A:
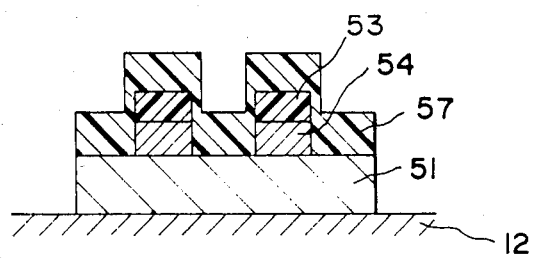
FIGS. 10A and 10B are cross sectional views used to explain a modification of the sequential steps as shown in FIGS. 9A-9E.
Figure 10B:
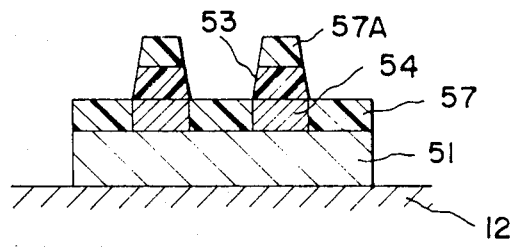

Furthermore, in the step for obtaining the structure as shown in FIG. 9C, $SiO_2$ can be further deposited over the $SiO_2$ thin film 56 to form a relatively thick $SiO_2$ film 57 as shown in FIG. 10A. Thereafter, the $SiO_2$ film 57 is etched by Ar ions so that the resist pattern 53 is exposed as shown in FIG. 10B. In this case, the side surfaces of the resist pattern 53 are slightly etched out and the $SiO_2$ film 57A is also deposited on the resist pattern 53. After the resist pattern 53 has been exposed, not only the resist pattern 53 but also the $SiO_2$ film 57A are removed by the $O_2$ plasma, whereby the structure as shown in FIG. 9E is obtained.

When the film forming apparatus of the abovementioned embodiments of the present invention is used in the planarization process utilizing resist, a series of steps from the deposition step of an insulator film to the lift-off step can be carried out in the same vacuum chamber, so that the present invention has a high throughput as compared with the conventional lift-off process. In addition, the resist is exposed by the etching by the Ar ions, so that there is an advantage that the planarization process in accordance with the present invention is not dependent upon the morphology of a resist pattern.

As described above, according to the present invention, the plasma generating chamber and the specimen chamber are separated from each other and a voltage such as rf is applied to the substrate electrode in such a way that the ions are controlled and deposition particles are deposited on the specimen placed on the substrate electrode to form a planarized thin film. Thus, the effects, features and advantageous of the present invention may be summarized as follows:

(i) The deposition particles vertically arrive at the specimen substrate with a high degree of directionality so that submicron interconnections with an aspect ratio substantially equal to or higher than 1.0 can be planarized.

(ii) In addition to the variation of the rf power, the flow rates of material gases and the Ar gas can be controlled so that the ratio between the deposition rate and the etching rate can be varied in a wide range. As a result, the conditions for planarization can be set in a simple manner. In addition, the planarization can be attained with a relatively low rf power, so that damage can be minimized.

(iii) In the case of deposition of $SiO_2$, the sputtering effect by $O_2$ ions can be obtained by the application of an rf bias, which is considerably different from the bias sputtering method in which etching is carried out only with Ar ions. While Si and $SiO_2$ are etched by $O_2$ ions, metals such as Al are not etched. As a result, it is not needed to introduce Ar in the initial stage of deposition, so that an rf power can be applied in the initial stage of the planarization process and the planarization time can be shortened.

(iv) In addition, an ion source and ions impinging upon a specimen substrate can be controlled independently of each other, so that both the deposition rate and the etching rate can be freely selected.

What is claimed is:

1. A method for forming a thin film to planarize a surface of a semiconductor device having convex and concave regions by an apparatus comprising:
   a plasma generating chamber into which a gas is introduced to produce plasma;
   a specimen chamber having a window;
   a substrate electrode disposed in said specimen chamber for receiving a specimen substrate having interconnections thereon, said substrate electrode being disposed below said window;
   a first gas introducing means for selectively introducing at least one of a first material gas of a thin film to be deposited on said specimen substrate and an inert gas into said plasma generating chamber;
   a second gas introduction means for introducing a second material gas of a thin film to be deposited on said specimen substrate into said specimen chamber;
   means for introducing plasma from said plasma generating chamber into said specimen chamber via said window and for impinging the introduced plasma substantially perpendicularly upon said specimen substrate; and
   a bias electrical power source means for applying a high frequency bias voltage to said substrate electrode such that the ions of said at least one of said first material gas and said inert gas, which impinge substantially perpendicularly upon said specimen substrate, have sufficient energy for etching the film deposited on said specimen substrate, said method comprising the steps of:

placing a specimen substrate on said substrate electrode;

maintaining both said plasma generating chamber and said specimen chamber in a vacuum condition;

introducing said first material gas and said second material gas from said first and second gas introduction means, respectively, the ions of said first material gas being such that said interconnections are seldomly etched therewith and thin film consisting essentially of particles resulting from the rection between said first and second material gases in etched therewith; and forming a thin film having a planar surface by said first and second material gases on said specimen substrate including said interconnections by applying a bias voltage from said bias electrical power source means to said substrate electrode, so that said ions of said first material gas impinge substantially perpendicularly upon said specimen substrate to etch said thin film during the formation of said thin film.

2. A method for forming a thin film as claimed in claim 1, wherein a microwave power and a magnetic field are supplied to said plasma generating chamber so as to generate plasma of said first material gas under a condition of electron cyclotron resonance and the generating plasma is introduced into said specimen chamber under the interaction with said magnetic field so that said plasma reacts with said second material gas to direct said particles to impinge substantially vertically upon said specimen substrate.

3. A method for forming a thin film as claimed in claim 2, wherein said microwave power, said bias voltage, the flow rates of said first and second material gases and the flow rate of said inert gas are varied so that the relative relationship between said film deposition rate and said etching rate is controlled to a desired relationship.

4. A method for forming a thin film as claimed in claim 1, wherein said step of forming said thin film includes the steps of:
   introducing first only said first material gas into said plasma generating chamber; and introducing said inert gas into said plasma generating chamber after said thin film has a thickness substantially equal to a thickness of said interconnections.

5. A method for forming a thin film as claimed in claim 4, wherein said bias voltage is selected such that a value obtained by dividing a power corresponding to said bias voltage by an area of said substrate electrode is at least 0.88 (w/cm$^2$).

6. A method for forming a thin film as claimed in claim 1, wherein said bias voltage is selected such that a value obtained by dividing a power corresponding to said bias voltage by an area of said substrate electrode is at least 0.88 (w/cm$^2$).

7. A method for forming a planar film to planarize a surface of a semiconductor device having a convex and concave regions by an apparatus comprising:
   a plasma generating chamber into which a gas is introduced to produce plasma;
   a specimen chamber having a window;
   a substrate electrode disposed in said specimen chamber for receiving a specimen substrate having interconnections thereon, said substrate electrode being disposed below said window;
   a first gas introducing means for selectively introducing at least one of a first material gas of a thin film to be deposited on said specimen substrate and an inert gas into said plasma generating chamber;
   a second gas introduction means for introducing a second material gas of a thin film to be deposited on said specimen substrate into said specimen chamber;
   means for introducing plasma from said plasma generating chamber into said specimen chamber via said window and for impinging the introduced plasma substantially perpendicularly upon said specimen substrate; and
   a bias electrical power source means for applying a high frequency bias voltage to said substrate electrode such that the ions of said at least one of said first material gas and inert gas, which impinge substantially perpendicularly upon said specimen substrate, have sufficient energy for etching the film deposited on said specimen substrate, said method comprising the steps of:
   placing a specimen substrate having a convex surface on its surface and a resist pattern formed on said convex pattern on said substrate electrode;
   maintaining both said plasma generating chamber and said specimen chamber in a vacuum condition;
   introducing a first material gas and a second material gas from said first and second gas introduction means, respectively, the ions of said first material gas being such that said interconnections are seldomly etched therewith and a thin film consisting essentially of particles resulting from the reaction between said first and second material gases is etched therewith;
   depositing a thin film consisting of particles resulting from the reaction between said first and second material gases upon said specimen substrate while applying no bias voltage from said bias electrical power source to said substrate electrode;
   introducing said inert gas from said first gas introduction system into said plasma generating chamber while said bias voltage is being applied to said substrate electrode;
   effecting the deposition of said particles upon said specimen substrate and the etching of the deposited film simultaneously, so that the recess between said convex patterns is filled with the deposited films of said particles to a depth substantially equal to the thickness of said convex pattern; and
   introducing only said first material gas from said first gas introduction system into said plasma generating chamber while the introduction of said second material gas from said second gas introduction system into said specimen chamber is interrupted, thereby removing said resist pattern so that said convex pattern is substantially coplanar with the deposited film of said particles.

8. A method for forming a thin film as claimed in claim 7, wherein a microwave power and a magnetic field are supplied to said plasma generating chamber so as to generate plasma of said first material gas under a condition of electron cyclotron resonance and the generating plasma is introduced into said specimen chamber under the interaction with said magnetic field so that said plasma reacts with said second material gas to direct said particles to impinge substantially vertically upon said specimen substrate.

9. A method for forming a thin film to planarize a surface of a semiconductor device having convex and concave regions by an apparatus comprising:
   a plasma generating chamber into which a gas is introduced to produce plasma;
   a specimen chamber having a window;
   a substrate electrode disposed in said specimen chamber for receiving a specimen substrate having interconnections thereon, said substrate electrode being disposed below said window;
   a first gas introducing means for selectively introducing at least one of a first material gas of a thin film to be deposited on said specimen substrate and an inert gas into said plasma generating chamber;
   a second gas introduction means for introducing a second material gas of a thin film to be deposited on said specimen substrate into said specimen chamber;
   means for introducing plasma from said plasma generating chamber into said specimen chamber via said window and for impinging the introduced plasma substantially perpendicularly upon said specimen substrate; and
   a bias electrical power source means for applying a high frequency bias voltage to said substrate electrode such that the ions of said at least one of said first material gas and said inert gas, which impinge substantially perpendicularly upon said specimen substrate, have sufficient energy for etching the film deposited on said specimen substrate, said method comprising the steps of:
   placing a specimen substrate on said substrate electrode;
   maintaining both said plasma generating chamber and said specimen chamber in a vacuum condition;
   introducing said first material gas and said inert gas from said first gas introduction means and said second material gas from said second gas introduction means, respectively, the ions of said first material gas being such that said interconnections are seldomly etched therewith and a thin film consisting essentially of particles resulting from the reaction between said first and second material gases is etched therewith; and
   forming a thin film having a planar surface by said raw materials on said specimen substrate including said interconnections by applying a bias voltage from said bias electrical power source to said substrate electrode; and by increasing an amount of said inert gas from said first gas introduction system into said plasma generating chamber while said bias voltage is being applied to said substrate electrode, so that said ions of said first material gas and said ions of said inert gas impinge substantially perpendiculary upon said specimen substrate to etch said thin film during the formation of said thin film.

10. A method for forming a thin film as claimed in claim 9, wherein a microwave power and a magnetic field are supplied to said plasma generating chamber so as to generate plasma of said first material gas under a condition of electron cyclotron resonance and the generating plasma is introduced into said specimen chamber under the interaction with said magnetic field so that said plasma reacts with said second material gas to direct said particles to impinge substantially vertically upon said specimen substrate.

11. A method for forming a thin film as claimed in claim 10, wherein said microwave power, said bias voltage, the flow rates of said first and second material gases and the film rate of said inert gas are varied so that the relative relationship between said film deposition rate and said etching rate is controlled to a desired relationship.

12. A method for forming a thin film to planarize a surface of a semiconductor device having convex and concave regions by an apparatus comprising;
a plasma generating chamber into which a gas is introduced to produce plasma;
a specimen chamber having a window;
a substrate electrode disposed in said specimen chamber for receiving a specimen substrate having interconnections thereon, said substrate electrode being disposed below said window;
a first gas introducing means for selectively introducing at least one of a first material gas of a thin film to be deposited on said specimen substrate and an inert gas into said plasma generating chamber;
a second gas introduction means for introducing a second material gas of a thin film to be deposited on said specimen substrate into said specimen chamber;
means for introducing plasma from said plasma generating chamber into said specimen chamber via said window and for impinging the introduced plasma substantially perpendicularly upon said specimen substrate; and
a bias electrical power source means for applying a high frequency bias voltage to said substrate electrode such that the ions of said at least one of said first material gas and said intert gas, which impinge substantially perpendicularly upon said specimen substrate, have sufficient energy for etching the film deposited on said specimen substrate, said method comprising the steps of:
placing a specimen substrate on said substrate electrode;
maintaining both said plasma generating chamber and said specimen chamber in a vacuum condition;
introducing said first material gas and said second material gas from said first and second gas introduction means, respectively, the ions of said first material gas being usch that said interconnections are seldomly etched therewith and a thin film consisting essentially of particles resulting from the reaction between said first and second material gases is etched therewith; and
forming a thin film having a planar surface by said first and second material gases on said specimen substrate including said interconnections by applying a bias voltage from said bias electrical power source means to said substrate electrode and by increasing said bias voltage while said bias voltage is being applied to said substrate electrode, so that the ions of said first material gas impinge substantially perpendicularly upon said specimen substrate to etch said thin film during the formation of said thin film.

13. A method for forming a thin film as claimed in claim 12, wherein a microwave power and a magnetic field are supplied to said plasma generating chamber so as to generate plasma of said first material gas under a condition of electron cyclotron resonance and the generating plasma is introduced into said specimen chamber under the interaction with said magnetic field so that said plasma reacts with said second material gas to direct said particles to impinge substantially vertically upon said specimen substrate.

14. A method for forming a thin film as claimed in claim 13, wherein said microwave power, said bias voltage, the flow rates of said first and second material gases are varied so that the relative relationship between said film deposition rate and said etching rate is controlled to a desired relationship.

* * * * *